US012653027B2

(12) United States Patent
Chang

(10) Patent No.: US 12,653,027 B2
(45) Date of Patent: Jun. 9, 2026

(54) INTERCONNECT VIA METAL-INSULATOR-METAL (MIM) FUSE FOR INTEGRATED CIRCUITRY

(71) Applicant: Intel Corporation, Santa Clara, CA (US)

(72) Inventor: Yao-Feng Chang, Flagstaff, AZ (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 17/835,863

(22) Filed: Jun. 8, 2022

(65) Prior Publication Data

US 2023/0402369 A1    Dec. 14, 2023

(51) Int. Cl.
| | |
|---|---|
| *H10W 20/49* | (2026.01) |
| *G11C 17/16* | (2006.01) |
| *G11C 17/18* | (2006.01) |
| *H10W 20/00* | (2026.01) |
| *H10W 20/43* | (2026.01) |

(52) U.S. Cl.
CPC ........... *H10W 20/493* (2026.01); *G11C 17/16* (2013.01); *G11C 17/18* (2013.01); *H10W 20/089* (2026.01); *H10W 20/43* (2026.01)

(58) Field of Classification Search
CPC .. H10W 20/493; H10W 20/089; G11C 17/16; G11C 17/18; G11C 17/165; H01L 23/5256; H01L 21/76816; H01L 23/528; H01L 23/5226
See application file for complete search history.

(56) References Cited

U.S. PATENT DOCUMENTS

| | | | | |
|---|---|---|---|---|
| 6,261,937 | B1 * | 7/2001 | Tobben | H01L 21/76888 |
| | | | | 438/467 |
| 7,254,078 | B1 * | 8/2007 | Park | G11C 17/18 |
| | | | | 365/225.7 |
| 2005/0181546 | A1 * | 8/2005 | Madurawe | H03K 19/177 |
| | | | | 438/132 |

(Continued)

OTHER PUBLICATIONS

Chen, Zhanping, et al., "A 0.9-um2 1T1R Bit Cell in 14-nm High-Density Metal Fuse Technology for High-Volume Manufacturing and In-Field Programming", IEEE Journal of Solid-State Circuits, vol. 52, No. 4, Apr. 2017, 7 pgs.

(Continued)

*Primary Examiner* — Galina G Yushina
(74) *Attorney, Agent, or Firm* — Essential Patents Group, LLP

(57) ABSTRACT

Interconnect via metal-insulator-metal (MIM) fuse for integrated circuitry. Two electrode metallization features, which may be within a backend of an IC die, are coupled through a via comprising a fuse material layer. The fuse material layer passes a non-zero leakage current when a lower read voltage is applied across the electrode metallization features, and irreversibly forms an open circuit when a higher programming voltage is applied across the electrode metallization features. The fuse material layer may be a compound of a metal and oxygen and be sufficiently thin to ensure a significant leakage current at the read voltage. Joule heating of the fuse material layer may induce a void between the (Continued)

electrode metallization features as the leakage current through the fuse material layer increases under higher voltages, creating an open circuit.

20 Claims, 11 Drawing Sheets

(56) References Cited

U.S. PATENT DOCUMENTS

| | | | | |
|---|---|---|---|---|
| 2009/0278228 | A1* | 11/2009 | Hsu | H01L 23/53295 |
| | | | | 257/E23.149 |
| 2009/0278229 | A1* | 11/2009 | Yang | H01L 21/76888 |
| | | | | 257/E23.149 |
| 2013/0126817 | A1* | 5/2013 | Joshi | H10N 70/8825 |
| | | | | 257/E47.001 |
| 2014/0183688 | A1* | 7/2014 | Bao | H01L 23/5256 |
| | | | | 257/529 |
| 2016/0315175 | A1* | 10/2016 | He | H01L 23/5256 |
| 2017/0263554 | A1* | 9/2017 | Adusumilli | H10D 62/852 |
| 2021/0111129 | A1* | 4/2021 | Naylor | H01L 21/76856 |
| 2022/0037341 | A1* | 2/2022 | Liaw | H01L 23/5252 |
| 2022/0059552 | A1* | 2/2022 | Ashtekar | H10D 30/024 |

OTHER PUBLICATIONS

Feng, Li-Wei, et al., "Reproducible resistance switching of a relatively thin FeOx layer produced by oxidizing the surface of a FePt electrode in a metal-oxide-metal structure", Thin Solid Films 519 (2010), pp. 1536-1539.

Kteyan, Armen, et al., "Physics-based simulation of stress-induced and electromigration-induced voiding and their interactions in on-chip interconnects", Microelectronic Engineering 247 (2021), 7 pgs.

Kulkarni, Sarvesh H., et al., "A 5-V-Program 1-V-Sense Anti-Fuse Technology Featuring On-Demand Sense and Integrated Power Delivery in a 22-nm Ultra Low Power FinFET Process", IEEE Solid-State Circuits Letters, vol. 4, 2021, 4 pgs.

Li, Baozhen, et al., "Electromigration challenges for advanced on-chip Cu interconnects", Microelectronics Reliability 54 (2014), pp. 712-724.

Ogawa, E. T., et al., "Stress-Induced Voiding Under Vias Connected to Wide Cu Metal Leads", IEEE 40th Annual International Reliability Physics Symposium, 2002, pp. 312-321.

Tseng, I-Hsin, et al., "Electromigration failure mechanisms of {111}-oriented nanotwinned Cu redistribution lines with polyimide capping", Results in Physics 24 (2021), 6 pgs.

* cited by examiner

101

$V_{program}$

102

$V_{access}$

110

103

111

105

110    103    111

120

$W_1$ 130    130

$L_1$

108 y x

201

$V_{program}$

202

$V_{access}$

203

$V_g$

205

230

241    242

220

210    210

208    108 z x

801

Form Lower Electrode Metallization Over a Substrate
810

Deposit Dielectric Material Over Lower Electrode Metallization
820

Form Via Opening Through Dielectric Material
830

Deposit Fuse Material Layer Into Via Opening
840

Deposit Upper Electrode Metallization Into Via Opening
850

Complete IC Interconnect Metallization
860

BATTERY
1215

1205

1206

MEMORY AND/OR
PROCESSOR WITH
BACKEND MIM FUSE
1250

INTEGRATED
SYSTEM
1210

Processor Circuitry 1230

FEOL
Transistors
1232

BEOL Interconnect
Structure With MIM Via
Fuse
1240

1260

1220

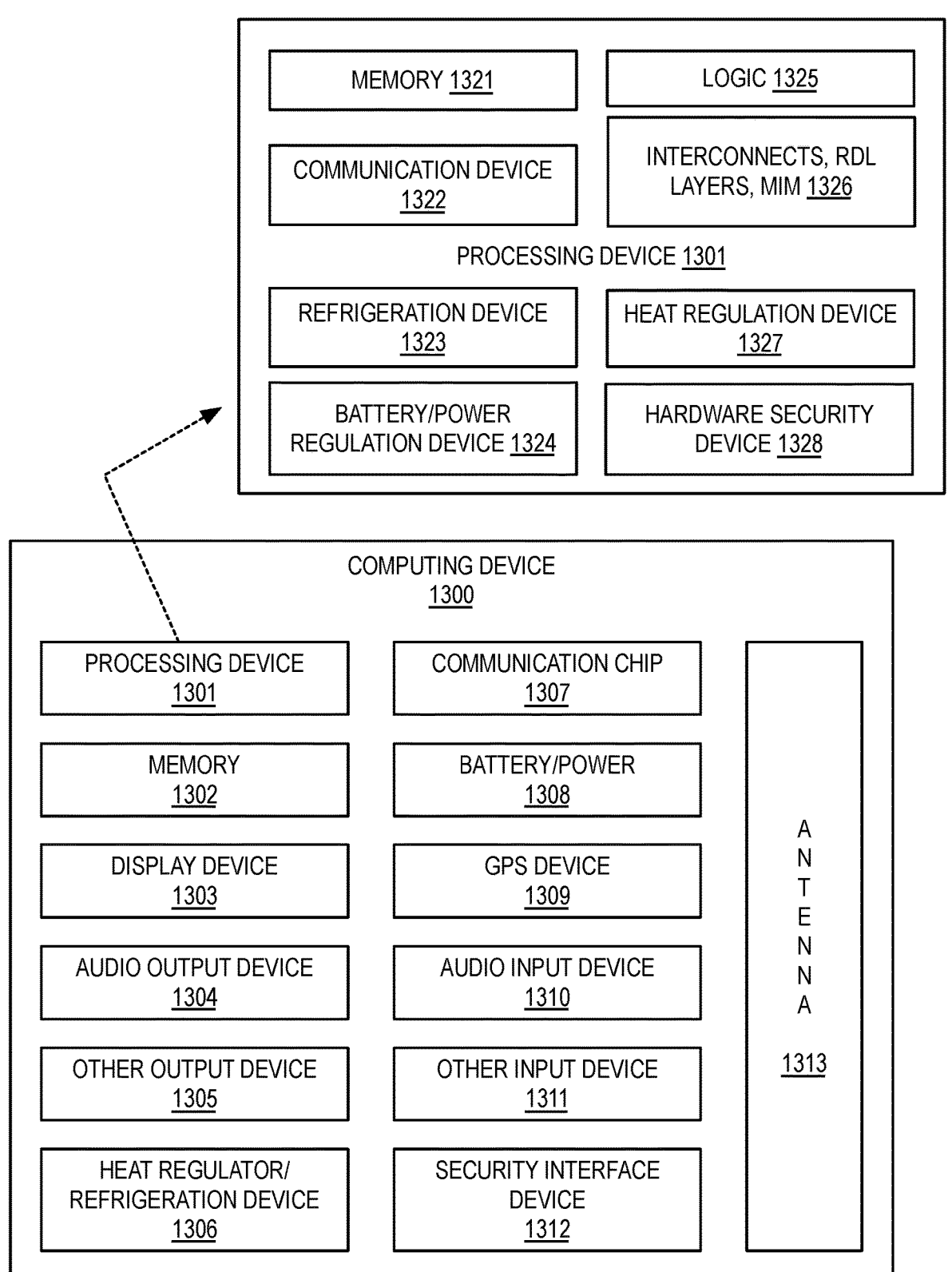

| MEMORY 1321 | LOGIC 1325 |
| COMMUNICATION DEVICE 1322 | INTERCONNECTS, RDL LAYERS, MIM 1326 |

PROCESSING DEVICE 1301

| REFRIGERATION DEVICE 1323 | HEAT REGULATION DEVICE 1327 |
| BATTERY/POWER REGULATION DEVICE 1324 | HARDWARE SECURITY DEVICE 1328 |

COMPUTING DEVICE
1300

| PROCESSING DEVICE 1301 | COMMUNICATION CHIP 1307 | |
| MEMORY 1302 | BATTERY/POWER 1308 | |
| DISPLAY DEVICE 1303 | GPS DEVICE 1309 | A N T E N N A |
| AUDIO OUTPUT DEVICE 1304 | AUDIO INPUT DEVICE 1310 | |
| OTHER OUTPUT DEVICE 1305 | OTHER INPUT DEVICE 1311 | 1313 |
| HEAT REGULATOR/ REFRIGERATION DEVICE 1306 | SECURITY INTERFACE DEVICE 1312 | |

FIG. 13

INTERCONNECT VIA
METAL-INSULATOR-METAL (MIM) FUSE
FOR INTEGRATED CIRCUITRY

BACKGROUND

Integrated circuit (IC) devices often comprise one-time programmable (OTP) read-only memory (ROM, or PROM), which continues to be a key technology among embedded memory categories. Various product applications, such as reconfigurable ROM, root-of-trust implementations (memory redundancy), on-chip security keys, and unit-level-traceability rely on a high-density OTP ROM offering reliable, available, and affordable information storage. Electrical-fuse (eFuse) and anti-fuse (AF) are the two most prevalent device technologies for implementing OTP ROM embedded within an IC device.

An electrical fuse is a sacrificial electrical device that initially provides a low electrical resistance/conductive path between two circuit nodes until an electrical current passed across the device exceeds a threshold level, which induces a permanent/irreversible high resistance/non-conductive open circuit. FIG. 1A is a circuit schematic of a fuse bit cell 101. Fuse bit cell 101 includes an access transistor (e.g., MOSFET) 102 between a voltage source and a first fuse electrode 110. Fuse electrode 110 is coupled to a second fuse electrode 111 through a resistor 103. Fuse electrode 111 is further coupled to a reference voltage, which is ground in this example. During a programming of bit-cell 101, access transistor 102 is enabled with a control gate voltage, which applies a program voltage to fuse electrode 110. When the program voltage is dropped across terminals of antifuse 201, Joule heating and/or electromigration occurs within resistor 103 causing resistor 103 to physically degrade into an open circuit.

FIG. 1B is a plan view of an interconnect line fuse 105, implementing fuse bit cell 101, in accordance with convention. An area of a dielectric material 108 is covered by an interconnect metallization trace or line 120 spanning a distance between two adjacent contacts 130. Interconnect trace or line 120, operable as resistor 103 (FIG. 1A), may be of any conductive material, such one or more metals employed for interconnect metallization. Interconnect trace or line 120 is patterned to have a longitudinal length $L_1$, which may vary to accommodate a minimum pitch of contacts 130. Interconnect trace or line 120 also has a minimum transverse width $W_1$. Fuse programming current requirements correspond to a cross-sectional area of interconnect trace or line 120 and is therefore a function of minimum transverse width $W_1$, which may be varied along with interconnect line thickness to set the fuse programming voltage threshold. A major disadvantage of interconnect line fuse 105 is the die area required, and this disadvantage becomes worse as IC feature dimensions decrease and/or the occupied percentage of an IC device increases.

An antifuse is an electrical device that initially has a high resistance between two circuit nodes until voltage across the device exceeds a certain level, which then induces a permanent/irreversible low resistance/conductive path. FIG. 2A is a circuit schematic of an antifuse bit cell 201. During a programming operation, a program voltage is applied to a first terminal (e.g., anode) of antifuse 203. A second terminal (e.g., cathode) of antifuse 203 is coupled to ground, for example through a MOS pull-down access transistor 202. Hence, upon application of a control voltage to a gate of access transistor 202, the program voltage is dropped across terminals of antifuse 203, inducing dielectric breakdown in response to a high electric field.

As illustrated in the circuit schematic of FIG. 2A, an antifuse often employs a metal-insulator-metal (MIM) capacitor stack including a conductive material at both anode and cathode terminals separated by an insulator. Programming of antifuse 203 is through dielectric breakdown of the insulator by a voltage applied between the antifuse terminals. The dielectric breakdown induces an electrical short through the insulator. Conventional antifuse designs often employ a MOS transistor-based structure, as depicted in FIG. 2B. MOS antifuse 205 includes a transistor gate terminal 230 and a source/drain contacts 241, 242. The antifuse circuit path passes through a gate dielectric 220, a doped semiconductor 208, and impurity doped semiconductor source/drain material 210. Formation of the illustrated conductive path during a programming operation entails permanently/irreversibly breaking down gate dielectric 220, reducing the electrical resistance between gate terminal 230 and source/drain contacts 241, 242.

MOS-based antifuse designs require a bit-cell size sufficient to host both the MOS antifuse 205 and another MOS transistor used for programming MOS antifuse 205. While antifuse technology has traditionally been favored for its better density and security than fuse technology, the high voltage needed to program MOS antifuse 205 has become a significant disadvantage in terms of circuit complexity. For example, a MOS antifuse circuit design may require a high-voltage MOS transistor for the programming operation. The addition of such high-voltage MOS transistors along with low-voltage MOS transistors increases design and manufacturing complexity of an IC device.

Accordingly, an OTP bit-cell architecture of reduced size, and/or requiring lower programming voltage, would be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

Although the figures may illustrate embodiments where structures are substantially aligned to Cartesian axes (e.g., device structures having substantially vertical sidewalls), positive and negative (re-entrant) sloped feature sidewalls often occur in practice. For example, manufacturing non-idealities may cause one or more structural features to have sloped sidewalls. Thus, attributes illustrated are idealized merely for the sake of clearly describing salient features. In the figures:

FIG. 13 is a functional block diagram of an electronic computing device, in accordance with some embodiments.

DETAILED DESCRIPTION OF EXEMPLARY EMBODIMENTS

Figures 1A, 1B, 2A, 2B:
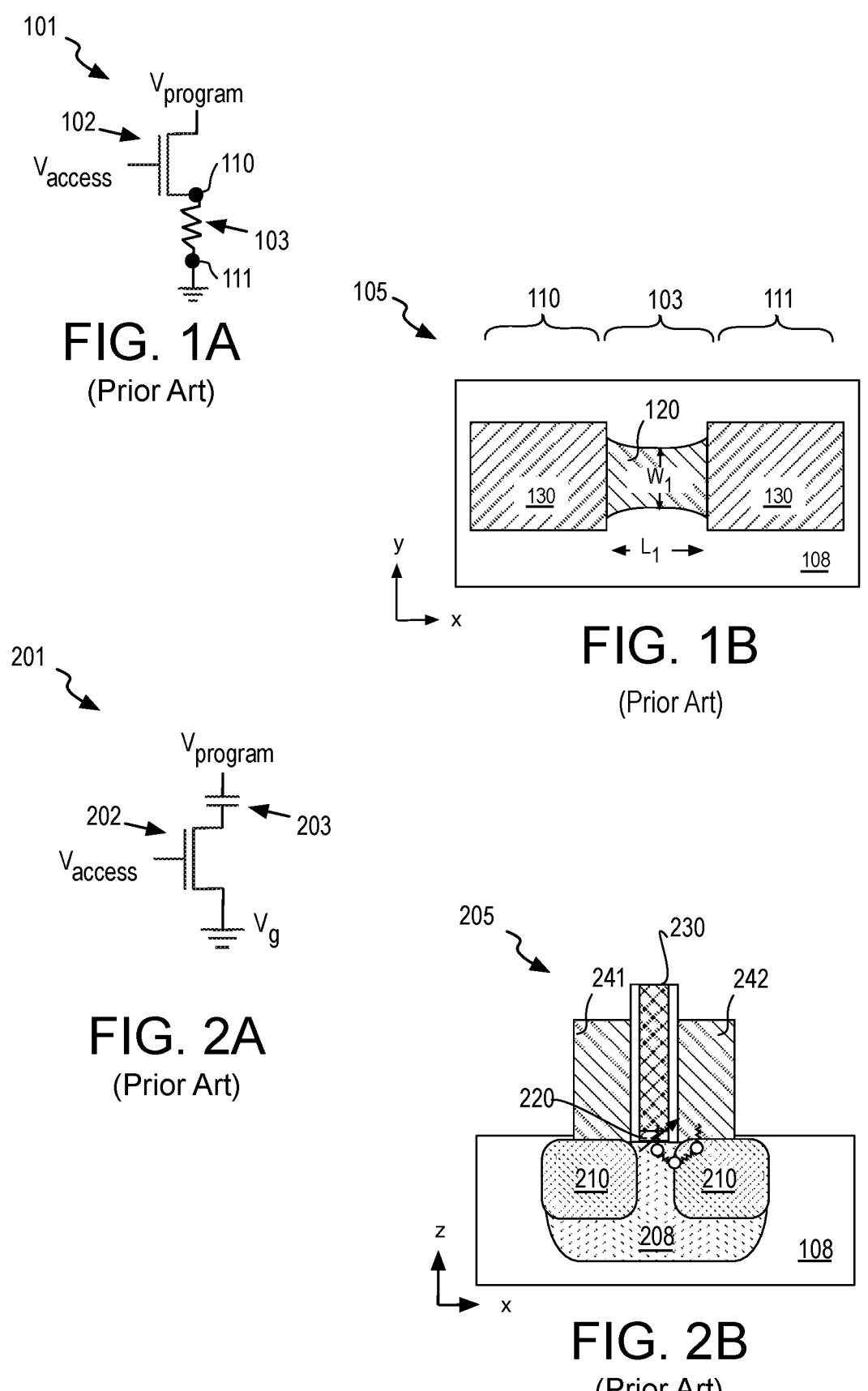
FIG. 1A is a fuse bit cell circuit schematic, in accordance with convention.
FIG. 1B is a plan view of an interconnect line fuse, in accordance with convention.
FIG. 2A is an antifuse bit cell circuit schematic, in accordance with an convention.
FIG. 2B is a cross-sectional view of a metal-oxide-semiconductor (MOS) fuse, in accordance with convention.

Embodiments are described with reference to the enclosed figures. While specific configurations and arrangements are depicted and discussed in detail, this is for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Integrated circuit interconnect structures including interconnect via metal-insulator-metal (MIM) fuses are described below. As a fuse, the via MIM fuse structures described herein irreversibly transition from an electrically conductive state where a significant current can pass between two electrodes to an electrical open state where no significant current can pass between the two electrodes. In contrast to a conventional metal interconnect fuse, the via MIM fuse structures described herein comprise an electrically insulative fuse material layer between two electrodes, similar to an antifuse. However, in contrast to an antifuse, the insulative fuse material layer of the via MIM fuse structures described herein passes a significant leakage current between the fuse electrodes at voltages below a programming voltage. In response to a higher voltage (e.g., exceeding a programming threshold), the leakage current induces an open circuit condition between the two fuse electrodes. This fuse behavior contrasts with an antifuse response whereby in absence of any significant leakage current, the insulative layer of the antifuse experiences dielectric breakdown at sufficiently high voltages leading to an electrical short condition.

As described further below, a high fuse density is possible by locating a MIM fuse within an interconnect via structure. Also, the via MIM fuses described herein may be based on capacitor MIM process modules integrated into back-end-of-line (BEOL) IC device interconnect fabrication. For example, an existing MIM capacitor fabrication process may be modified to integrate a via structure, in accordance with embodiments herein, and to alter the thickness and/or composition of the MIM insulator material layer for an adequate leakage current and low programming voltage response. As will also become apparent, a power-performance-area-cost (PPAC) metric for the via MIM fuses described herein can be superior to both metal fuse technology and MOS antifuse technology.

Figure 3A:
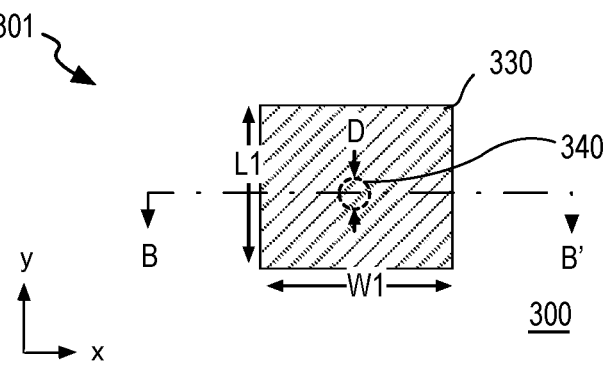
FIG. 3A is a top-down plan view of an interconnect via metal-insulator-metal (MIM) fuse, in accordance with some embodiments.

FIG. 3A is a top-down plan view of an interconnect via metal-insulator-metal (MIM) fuse 301, in accordance with some embodiments. As shown in FIG. 3A, an area of a substrate 300 is covered by a fuse electrode 330 with a perimeter of fuse electrode 330 defining a lateral electrode width W1 and lateral electrode length L1 for a corresponding fuse electrode area. Fuse electrode 330 may be any electrically conductive material suitable for IC interconnects, capacitors, or other device contacts. In some embodiments, fuse electrode 330 is polycrystalline silicon, graphite, or one or more metal, such as, but not limited to, copper, tungsten, nickel, cobalt, aluminum, molybdenum, ruthenium, platinum, or titanium. For metal embodiments, fuse electrode 330 may be substantially one metal with only trace impurities. Alternatively, fuse electrode 330 may include a plurality of metals layered in a stack structure or compositionally graded. Fuse electrode 330 may also be a homogenous alloy of multiple metals, or comprise a grading of alloyed metals, etc. In some alloyed metal embodiments, fuse electrode 330 may be a metallic compound, such as one or more of metal-nitrides, metal-carbides, or metal-silicides.

Fuse electrode 330 is in electrical contact with an underlying via 340, drawn in dashed line in FIG. 3A to emphasize via 340 is below a portion of the area of fuse electrode 330. Via 340 occupies a smaller area over the IC substrate associated with a bottom via diameter D. Although via area may vary with implementation, in some examples via area is less than 0.5 $\mu m^2$ and advantageously no more than 0.2 $\mu m^2$ (e.g., bottom via diameter D<0.5 $\mu m$).

Figure 3B:
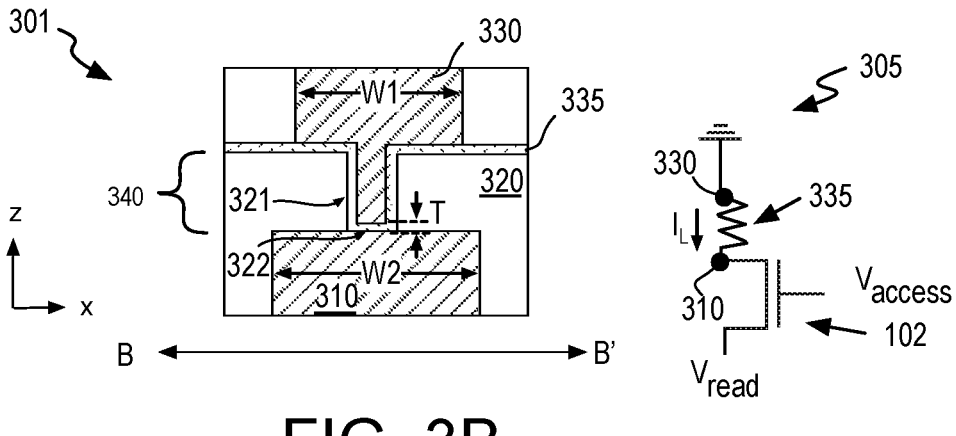
FIG. 3B is a cross-sectional view of the via MIM fuse shown in FIG. 3A and an associated circuit schematic, in accordance with some embodiments.

FIG. 3B is a cross-sectional view of fuse via MIM fuse 301 along the longitudinal B-B' line illustrated in FIG. 3A. A corresponding fuse circuit schematic is also illustrated. As shown in the cross-sectional view, via 340 extends through a thickness (e.g., z-dimension) of a dielectric material 320. Dielectric material 320 may have any chemical composition as embodiments are not limited in this respect. For example, dielectric material 320 may be silicon dioxide, silicon nitride, carbon-doped silicon dioxide, or other porous low-k materials known to be suitable for interlayer dielectric materials (ILD) found in the BEOL.

Via 340 is at least partially filled with metallization, and in the example illustrated, via metallization is contiguous with metallization of electrode 330, which is indicative of electrode metallization having been deposited into a via opening. As further illustrated, via 340 further comprises a fuse material layer 335, which is between the overlying via (electrode) metallization and an underlying fuse electrode 310. In the exemplary embodiment illustrated, fuse material layer 335 is in direct contact with fuse electrode 310 at a via bottom 322. Fuse material layer 335 in also in direct contact with a sidewall 321 of dielectric material 320. Outside of the perimeter of via 340, fuse material layer 335 is also between electrode 330 and dielectric material 320.

Fuse electrode 310 may be any electrically conductive material suitable for IC interconnects, capacitors, or other device contacts. More specifically, electrode 310 may have any chemical composition suitable for a bottom electrode of any metal-insulator-metal capacitor. Fuse electrode 310, may, for example, have any of the compositions described above for fuse electrode 330. Fuse electrode 310 may have the same composition as fuse electrode 330, or fuse electrode 310 may have a different composition than fuse electrode 330.

The chemical composition of fuse material layer 335 may also vary with implementation. In some exemplary embodiments, fuse material layer 335 is of a material that is more electrically insulative than either of fuse electrode 310 or fuse electrode 330. Fuse material layer 335 is therefore referred to herein as the insulator of a metal-insulator-metal (MIM) stack that further includes electrodes 310 and 330. In some advantageous embodiments, fuse material layer 335 is an oxide compound. In addition to comprising oxygen, fuse material layer 335 may comprise one or more of silicon, nitrogen, or a metal. Fuse material layer 335 may have a higher relative permittivity than dielectric material 320, for example. As an insulator, fuse material layer 335 may be a dielectric or a ferroelectric, etc. In some exemplary embodiments, fuse material layer 335 is a metal oxide comprising predominantly oxygen and one or more metals. In some metal oxide embodiments, fuse material layer 335 is predominantly Hf and oxygen (e.g., $HfO_2$). In alternative embodiments, fuse material layer 335 is predominantly oxygen and at least one of Ti (e.g., $TiO_2$), Al (e.g., $Al_2O_3$), Zn (e.g., $ZnO_2$), W (e.g., $WO_3$), Cu (e.g., $CuO$). In still other embodiments, fuse material layer 335 is predominantly silicon and at least one of oxygen or nitrogen (e.g., $SiO_2$ or $Si_3N_4$).

Regardless of composition, fuse material layer 335 is to be of significantly lower electrical resistivity than would be suitable for an insulator of a charge storage capacitor. Insulator compositions with higher relative permittivity advantageously have lower electrical resistivity to ensure a leakage current $I_L$ through fuse material layer 335 is sufficient for fuse circuit 305, which passes a significant electrical current $I_L$ at lower voltages (e.g., a read voltage $V_{read}$). Current $I_L$ is limited to the smallest via cross-sectional area (e.g., via bottom 322) since regions of electrodes 310 and 330 outside of via 340 are separated by a much greater thickness of dielectric material 320. Electrical resistance is a function of fuse material resistivity multiplied by the thickness of the material layer and divided by the area through which the current passes. The thickness T of fuse material layer 335 separating electrodes 310, 330 may be selected to provide a certain electrical resistance for a given via area (or via diameter D). A thinner fuse material layer 335 will advantageously provide a larger leakage current for a given voltage across electrodes 310, 330. For some exemplary embodiments where fuse material layer 335 is a metal oxide (e.g., $HfO_2$), fuse material layer thickness T is less than 10 nm (e.g., 5-9 nm), and may be below 5 nm.

Figure 4:
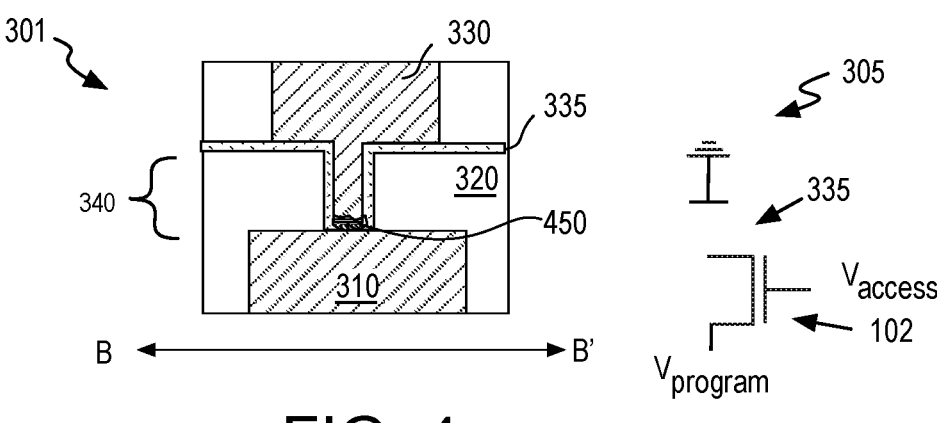
FIG. 4 is a cross-sectional view of the via MIM fuse shown in FIG. 3B after passing a programming voltage and an associated circuit schematic, in accordance with some embodiments.

FIG. 4 is a cross-sectional view of the via MIM fuse 301 after passing a programming voltage. The corresponding open circuit state of fuse circuit 305 is also illustrated in FIG. 4. Because fuse material layer 335 passes current $I_L$, current-based phenomenological material degradation mechanisms can become significant at higher currents associated with a programming voltage $V_{program}$. Degradation of fuse material layer 335 may be associated with Joule heating (thermal) and/or electromigration (EM) mechanisms. Although not bound by theory, for some exemplary embodiments where fuse material layer 335 is a metal oxide (e.g., $HfO_2$), fuse material layer 335 may degrade through the migration of oxygen ions into one of the electrodes 310, 330 (depending on polarity of the programming voltage $V_{program}$). With such physical degradation mechanisms confined to via bottom 322, the physical degradation can rapidly accumulate into a void 450 within the portion of fuse material layer 335 occupying the area of via bottom 322. Within this small area, void 450 may, for example, span the entire fuse material layer thickness T. In practice, such voids may have an area nearly equal to, or larger than, the area of via bottom 322, inducing a large drop in electrical current between electrodes 310, 330.

Figure 5:
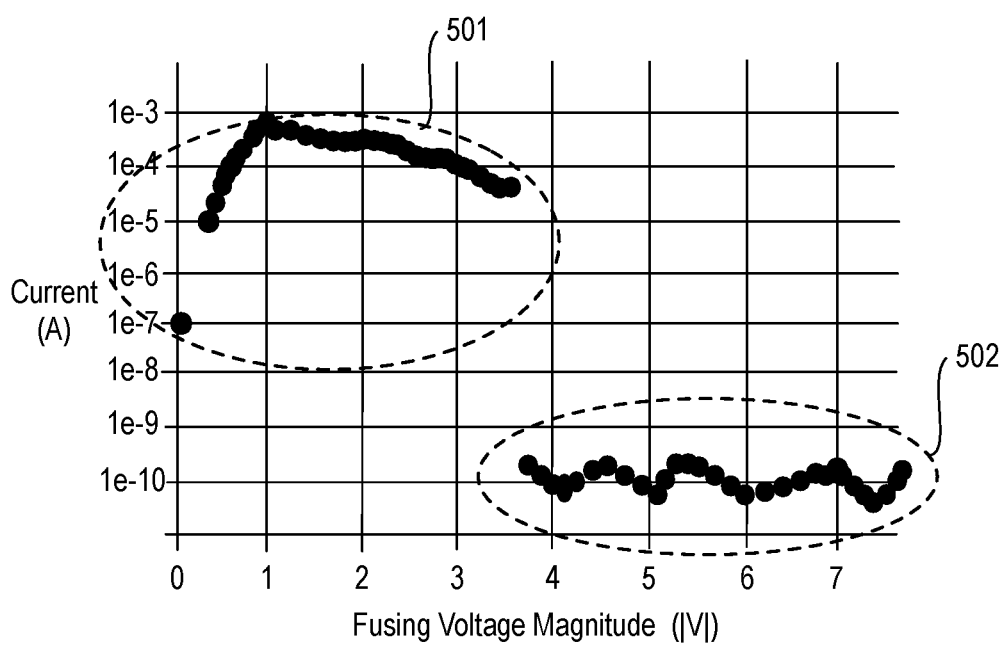
FIG. 5 is an I-V graph of a via MIM fuse before and after programming, in accordance with some embodiments.

FIG. 5 is an I-V plot of a via MIM fuse before and after programming, in accordance with some embodiments. In FIG. 5, the magnitude of a DC voltage applied between two fuse electrodes and across the intervening fuse material insulator is plotted to the x-axis. A current measured between the two fuse electrodes is plotted to the y-axis. As shown, within a first fuse state (e.g., unprogrammed) 501, electrical current through the MIM via fuse initially is a substantially linear function of voltage, as expected for a resistor. From a maximum current of ~1 e-3 A, the current trends down even though voltage continues to increase until the current abruptly falls by approximately five orders of magnitude to ~1e-10 A, or less. In a second fuse state (e.g., programmed) 502, there is no significant electrical current regardless of the applied voltage. Via MIM fusing induces the transition between states 501 and 502. In this example, the fuse programming voltage magnitude is around 3.5V. Notably, in this example the resistance ratio between the two fuse states 501, 502 is >$10^6$, which is very competitive with alternative fuse and antifuse architectures.

Figure 6:
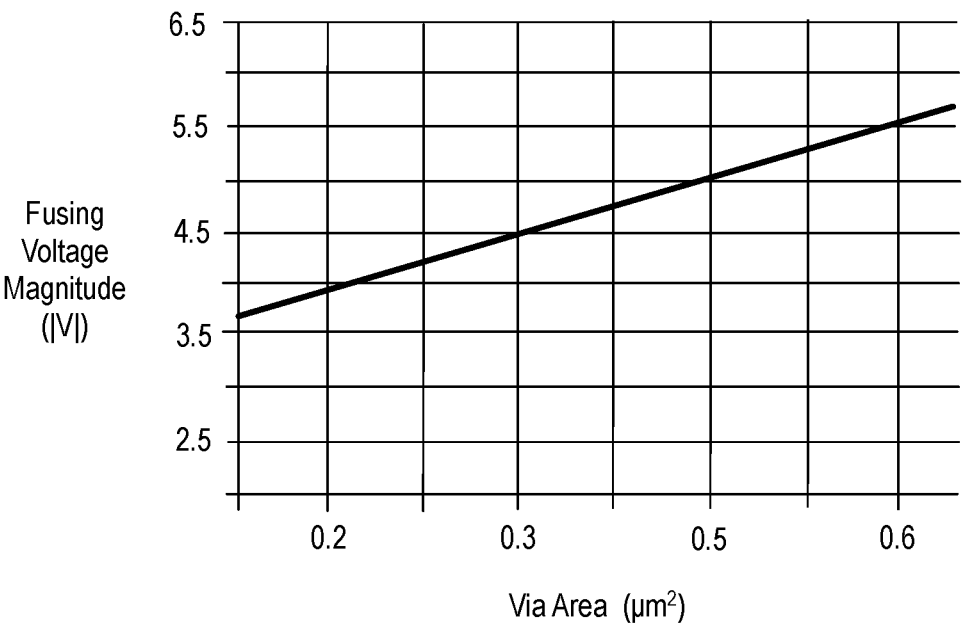
FIG. 6 is a graph of programming voltage as a function of cross-sectional area of a via MIM fuse, in accordance with some embodiments.

FIG. 6 is a graph of a trend line for the magnitude programming voltage of a via MIM fuse as a function of cross-sectional area of the via, in accordance with some embodiments. In this example, the programming voltage is around 3.5 V for 0.16 $\mu m^2$, increases with larger via areas, and decreases with smaller via areas.

Figure 7:
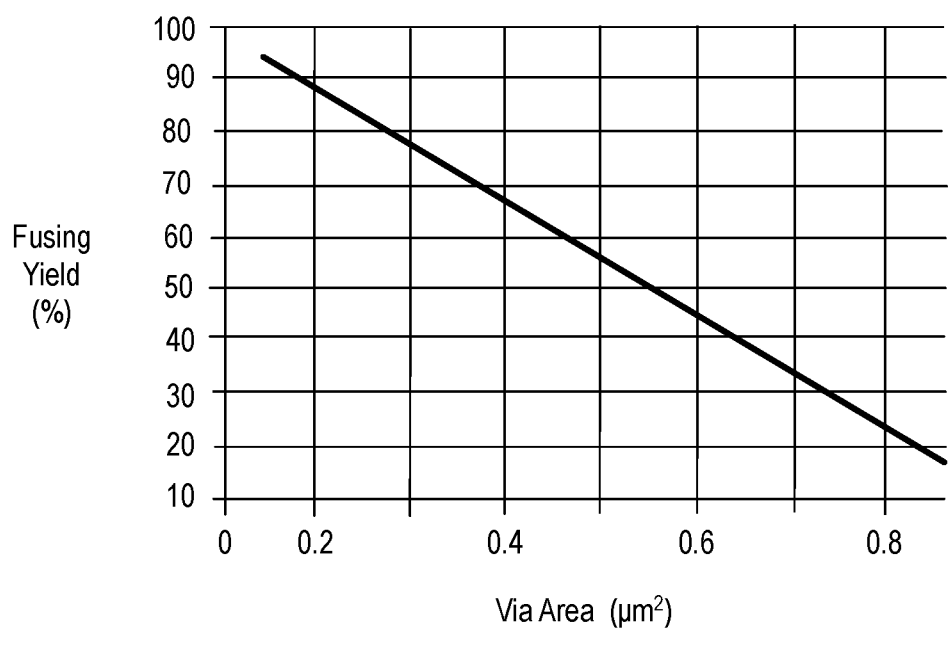
FIG. 7 is a graph of via MIM fusing yield as a function of cross-sectional area of the via MIM fuse, in accordance with some embodiments.

FIG. 7 is a graph of via MIM fusing yield as a function of cross-sectional area of a via MIM fuse, in accordance with some embodiments. As shown, the percentage of via MIM fuses that show a proper fuse response is highest for smallest via area, which suggests that via area scaling advantageous for lower programming voltage is also advantageous for fuse yield, and is compatible with the general CMOS scaling trend.

Figure 8:
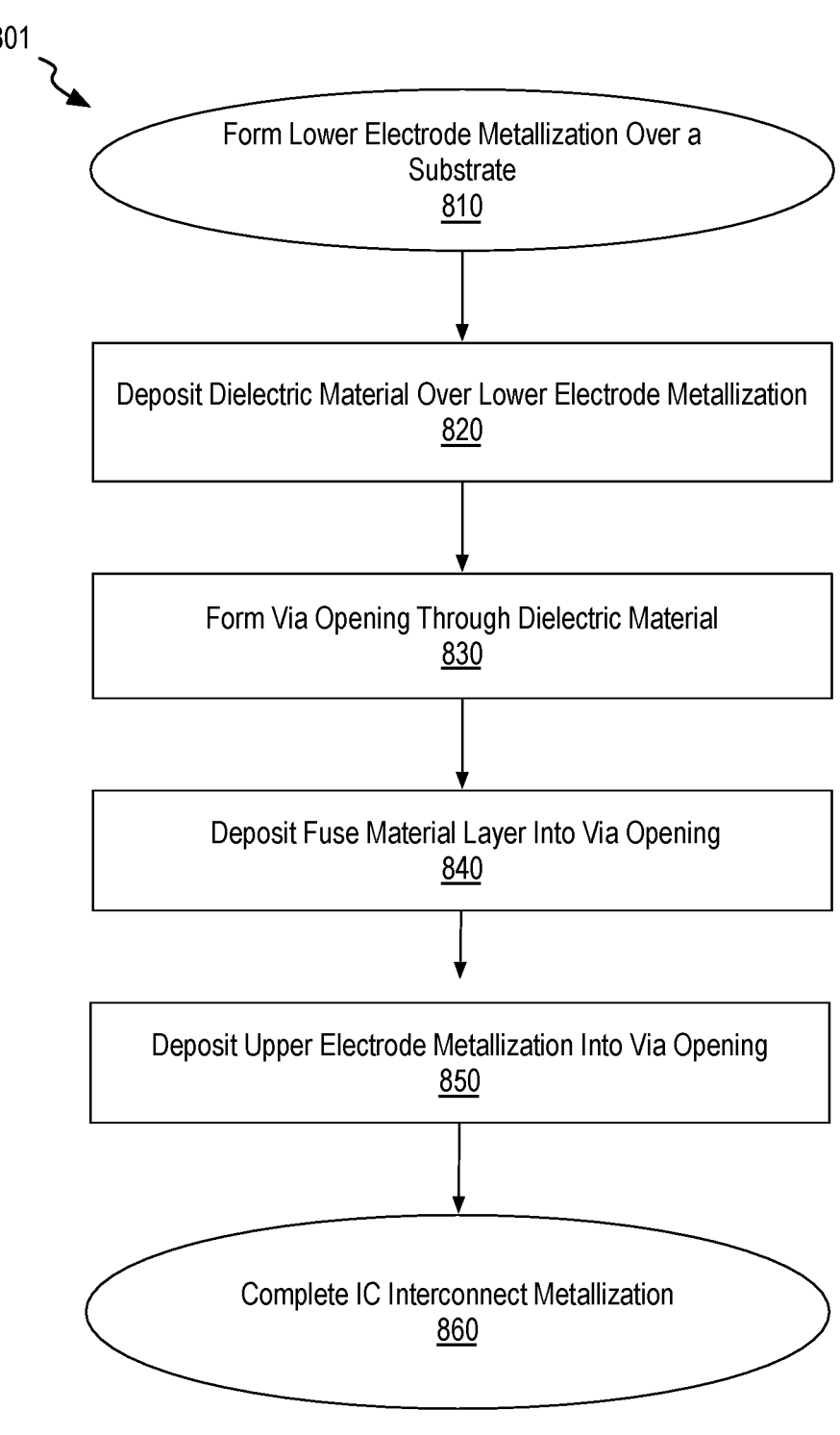
FIG. 8 is a flow diagram illustrating methods of fabricating a via MIM fuse within interconnect metallization levels of an IC die, in accordance with some embodiments.

A via MIM fuse, as well as an IC incorporating such a fuse, may be fabricated according to a wide variety of techniques. FIG. 8 is a flow diagram illustrating some exemplary methods 801 for fabricating a via MIM fuse within interconnect metallization levels of an IC die. FIG. 9A-9D are cross-sectional views of an IC structure portion 901 evolving as the methods 801 are practiced in accordance with some embodiments. IC structures other than IC structure portion 901 may be fabricated according to methods 801. For example, MIM fuse 301 (FIG. 3A-3C) may also be fabricated accordingly to methods 801. Similarly, IC structure portion 901 may be fabricated according to a method distinct from methods 801.

Referring first to FIG. 8, methods 801 begin at input 810 where first fuse electrode metallization is formed over an IC substrate. The IC substrate may include any base material known to be suitable for IC fabrication, such as a large format (e.g., 300-450 mm) wafer. One or more lithographic patterning processes may be performed at input 810. For example, a single or a double patterning process may be practiced to define first electrode metallization of any suitable chemical composition and having any suitable lateral and vertical dimensions. In some embodiments, one or more damascene-type line or via formation processes comprising metal planarization are performed at input 810 based on the lithographic patterning process(es). In alternative embodiments, one or more subtractive line or via patterning process(es) are performed at input 810 based on the lithographic patterning process(es).

Figure 9A:
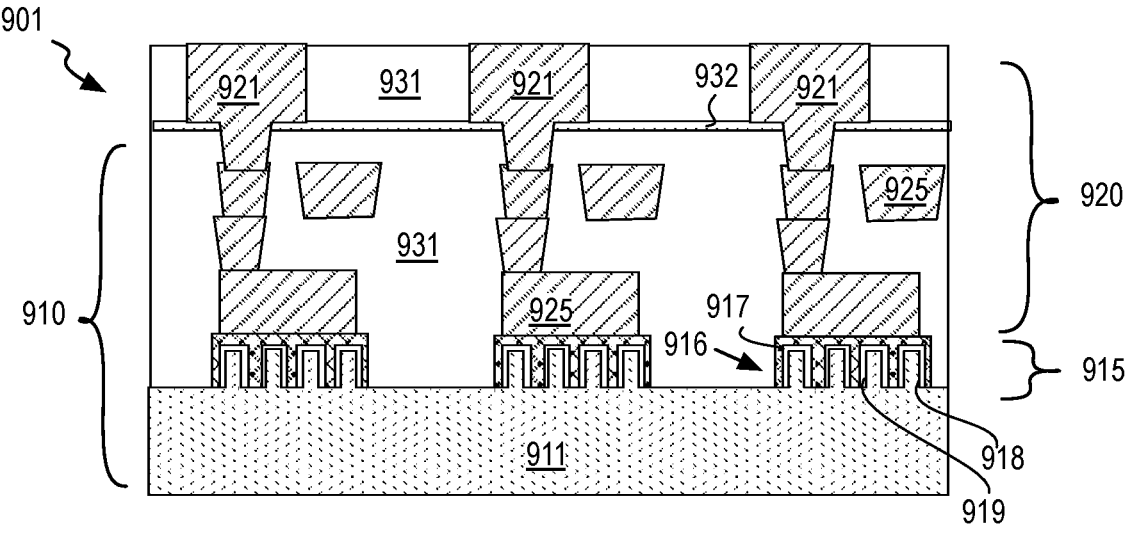
FIGS. 9A, 9B, 9C and 9D are cross-sectional views of an IC structure evolving as the methods illustrated in FIG. 8 are practiced in accordance with some embodiments.
Figure 9B:
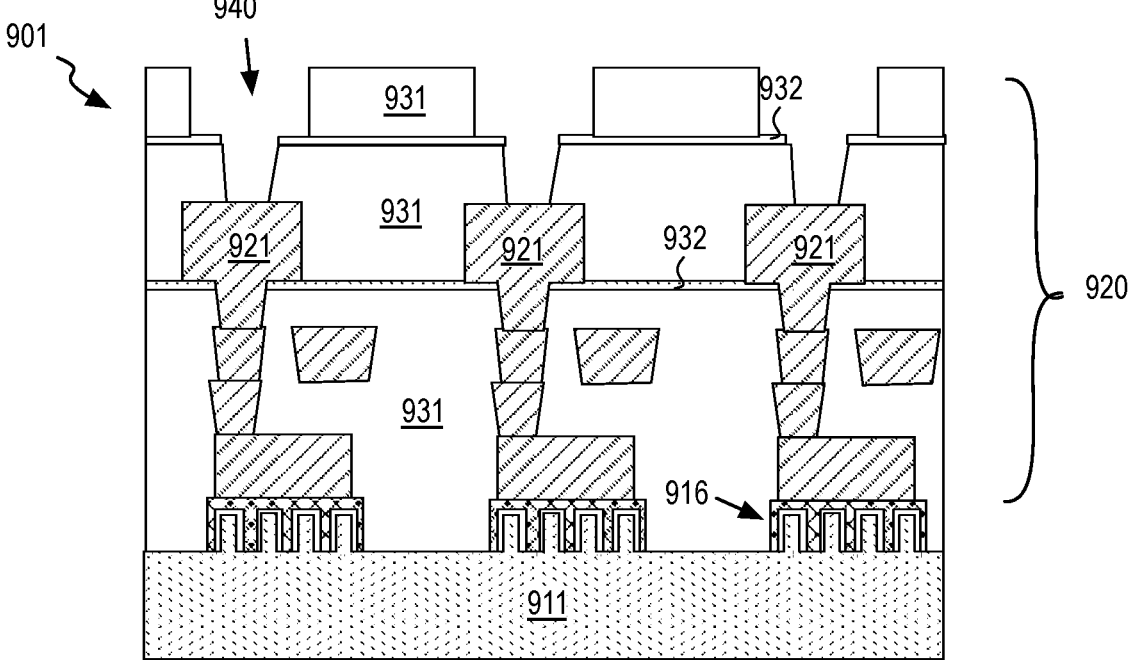
Figure 9C:
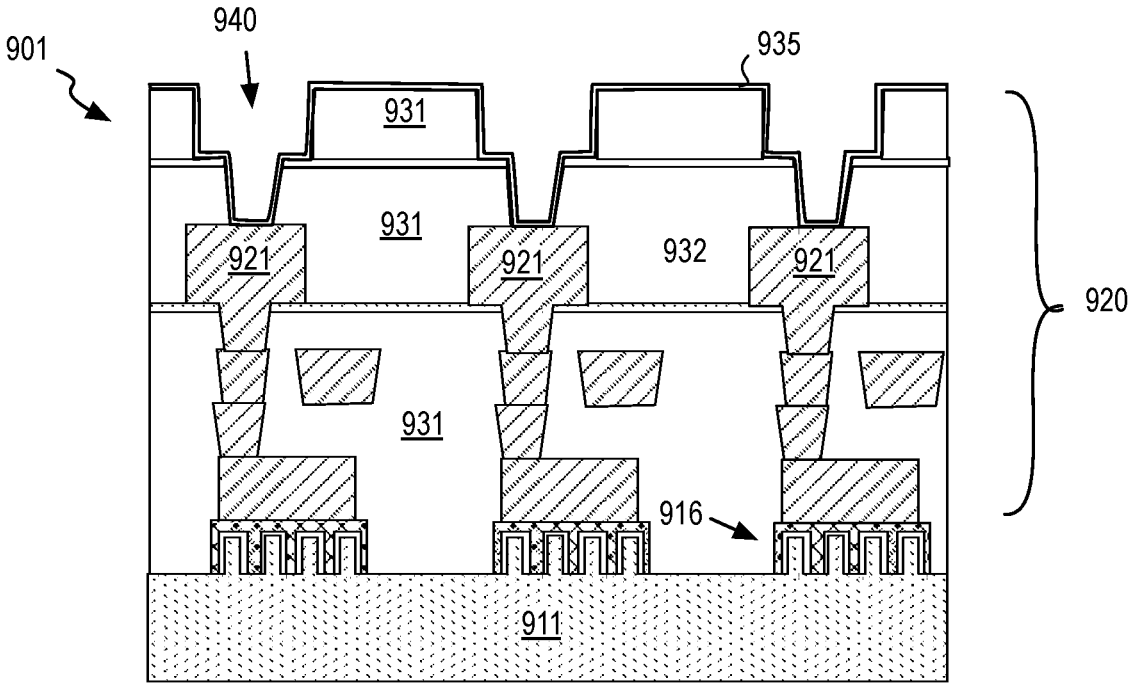

FIG. 9A further illustrates an exemplary IC structure portion 901 including first electrode metallization 921 over an IC substrate 910 comprising a base material 911. In some examples, base material 911 is substantially (mono)crystalline. Base material 911 may, for example, include one or more Group IV semiconductor material layers (e.g., Si, Ge, SiGe, GeSn, etc.), one or more Group III-V semiconductor material layers (e.g., InGaAs), one or more Group III-N semiconductor material layers (e.g., GaN), a combination of such semiconductor material layers, or other material (e.g., sapphire) known to be suitable as a workpiece substrate for IC device fabrication.

IC substrate 910 includes at least one device layer 915, each including one or more semiconductor materials. In the illustrated example, device layer 915 comprises non-planar field effect transistors (FETs) 916. FETs 916 may be finFETs, nanoribbon or nanosheet FETs, nanowire FETs, stacked ribbon or wire FETs, etc. In the plane of FIG. 9A, a gate electrode 917 and a channel semiconductor 918 separated by a gate insulator 919 are visible. Out of the plan of FIG. 9A, a source and drain (not depicted) are coupled to opposite ends of channel semiconductor 918. Channel semiconductor 918 may comprise any suitable monocrystalline semiconductor material (e.g., silicon, Ge, SiGe, GeSn, etc.). Such FETs may be part of any application specific IC (ASIC) including one or more IP cores, for example.

IC substrate 910 further includes interconnect levels 920 comprising metallization features 925 that electrically interconnect devices (e.g., FETs 916, DRAM memory cells, RRAM memory cells, MRAM memory cells, etc.) of one or more device layers including device layer 915. In some embodiments, circuitry within IC structure portion 901 comprises a microprocessor core, further including an arithmetic logic unit (ALU) and shift registers, for example. In other examples, circuitry within IC structure portion 901 comprises a wireless radio circuit or floating-point gate array (FPGA).

As illustrated, fuse electrode metallization 921 is a subset of metallization features 925 and separate features of electrode metallization 921 are arrayed over an area of IC structure portion 901 within one of interconnect levels 920. Electrode metallization 921 may have the same composition as other metallization features 925 or may be of a distinct composition specific to a fuse structure. Accordingly, electrode metallization 921 may comprise one or more of any conductive materials known to be suitable for IC interconnects or capacitor electrodes. In some embodiments, each of electrode metallization 921 comprises a metal, such as any of those described above. In some embodiments, electrode metallization 921 is predominantly W. In other embodiments, electrode metallization 921 is predominantly Ru, Co, Mo, Ti, or Pt. Electrode metallization 921 may be patterned according to subtractive or damascene techniques, with the latter being more suitable for embodiments where the chemical composition of electrode metallization 921 is not amenable to definition through etching processes.

Interconnect levels 920 include one or more dielectric materials 931 and 932 surrounding metallization features 925. The chemical composition of dielectric materials 931 and 932 may be any known to be suitable as an IC device interlayer dielectric (ILD). In some embodiments, dielectric materials 931 and 932 comprise oxygen and may further comprise silicon (e.g., $SiO_2$, SiOC(H), SiON, etc.). Dielectric materials 931 and 932 may have any thickness (e.g., in z-dimension), as embodiments are not limited in this context.

Returning to FIG. 8, methods 801 continue at block 820 where a dielectric material is deposited over the first (lower) fuse electrode metallization. The dielectric material may be any suitable as an interlayer dielectric (ILD) for IC interconnects and may be deposited to any thickness suitable for electrically isolated to adjacent levels of metallization. At block 830, a via opening is formed through the dielectric material, exposing a portion of the lower electrode metallization. Any via patterning (e.g., lithography and etch) process(es) known to be suitable for forming interconnect vias through dielectric material of a particular composition may be practiced at block 830. In the example further illustrated in FIG. 9B, additional dielectric materials 931, 932 have been deposited over electrode metallization 921. An array of via openings 940 have been etched through the thickness of dielectric material 931, each of the via openings 940 exposing a portion of a corresponding feature of electrode metallization 921. In this example, each of the via openings 940 are formed as part of a dual-damascene interconnect structure that further comprises a trench opening of larger area than the via opening.

Returning to FIG. 8, methods 801 continue at block 840 where a fuse material layer is deposited into the via opening.

In exemplary embodiments, a highly conformal deposition process is employed to precisely control the fuse material layer thickness. In some embodiments, a metal oxide is deposited with an atomic layer deposition (ALD) process employing a metal precursor (e.g., comprising Hf) and an oxygen precursor. Any number of ALD cycles may be performed, for example to form a fuse material layer 935 further depicted in FIG. 9C. In this exemplary embodiment, fuse material layer 935 has a substantially conformal thickness (e.g., less than 10 nm) and fully lines the dual-damascene structure.

Returning to FIG. 8, methods 801 continue at block 850 where another (upper) electrode metallization is deposited over the fuse material layer that is within the via opening. Electrode metallization may be deposited by any technique (s) known to be suitable for IC interconnect metallization and/or MIM capacitor electrode metallization. In some embodiments, a sputter deposition process and/or an electrolytic or electroless plating process is practiced at block 850. One or more metal may also be deposited by ALD. In some examples, multiple deposition processes are practiced at block 850, for example sputter-deposition of a seed layer may precede electrolytic plating of a fill metal. Methods 801 (FIG. 8) then end at output 860 where IC interconnect metallization is completed in any manner known to be suitable for IC device.

Figure 9D:
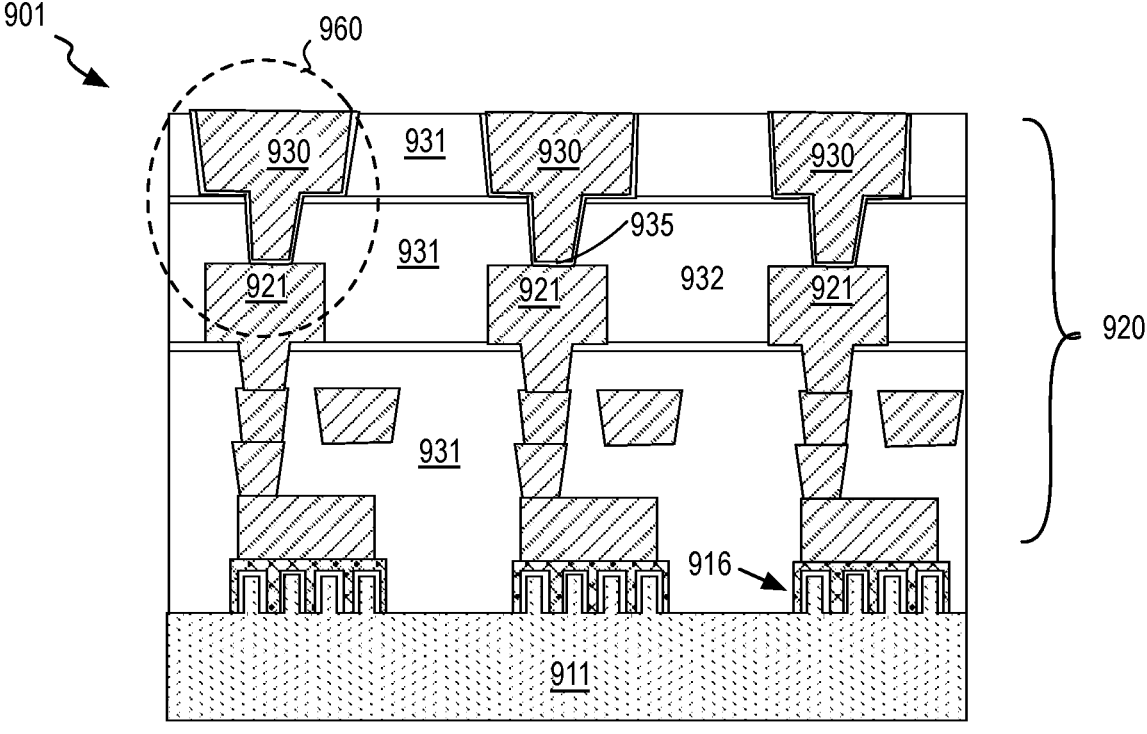

In the example illustrated in FIG. 9D, exemplary IC structure portion 901 further includes fuse electrode metallization 930, which substantially fills trenches and via openings within dielectric materials 931, 932. The array of via fuses 960 are then substantially complete, for example substantially as they may be found within an OTP ROM. Although not illustrated, any number of additional levels of interconnect metallization features may be formed over fuse electrode metallization 930. Following IC die singulation, packaging, and assembly into an electronic device, one or more of via fuses 960 may be programmed into an open circuit either in preparation for use in the field or during use in the field. Upon such programming, a void within fuse material 935 at the bottom of the via is formed in at least one of via fuses 960, for example substantially as illustrated for void 450 (FIG. 4).

Figure 10A:
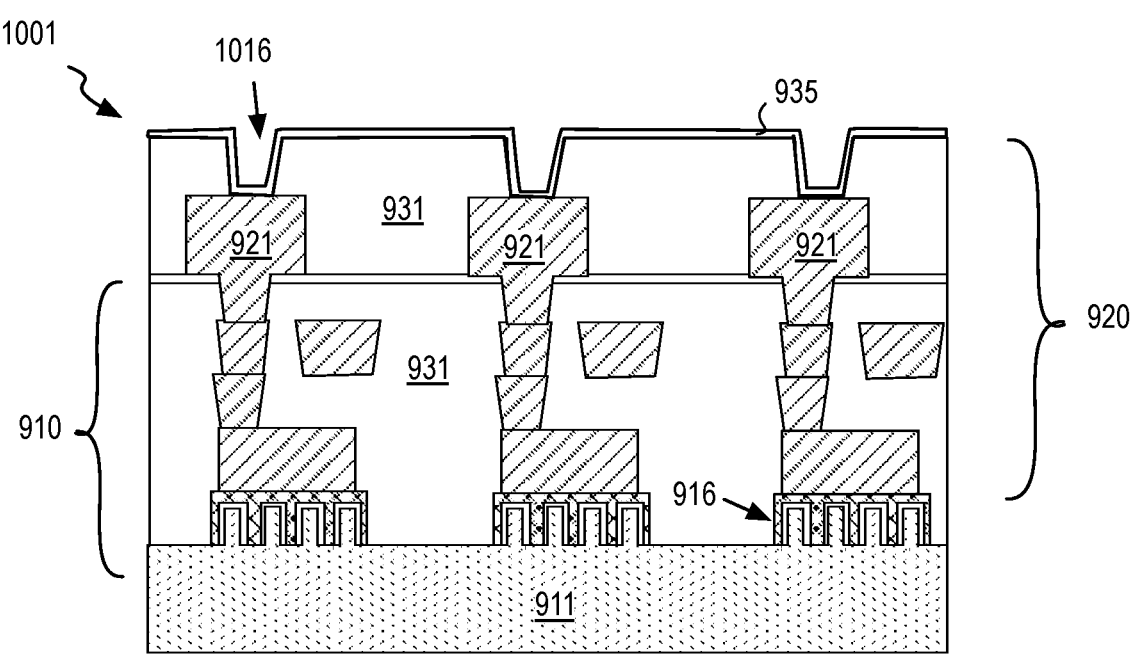
FIGS. 10A and 10B are cross-sectional views of an IC structure evolving as the methods illustrated in FIG. 8 are practiced in accordance with some alternative embodiments.
Figure 10B:
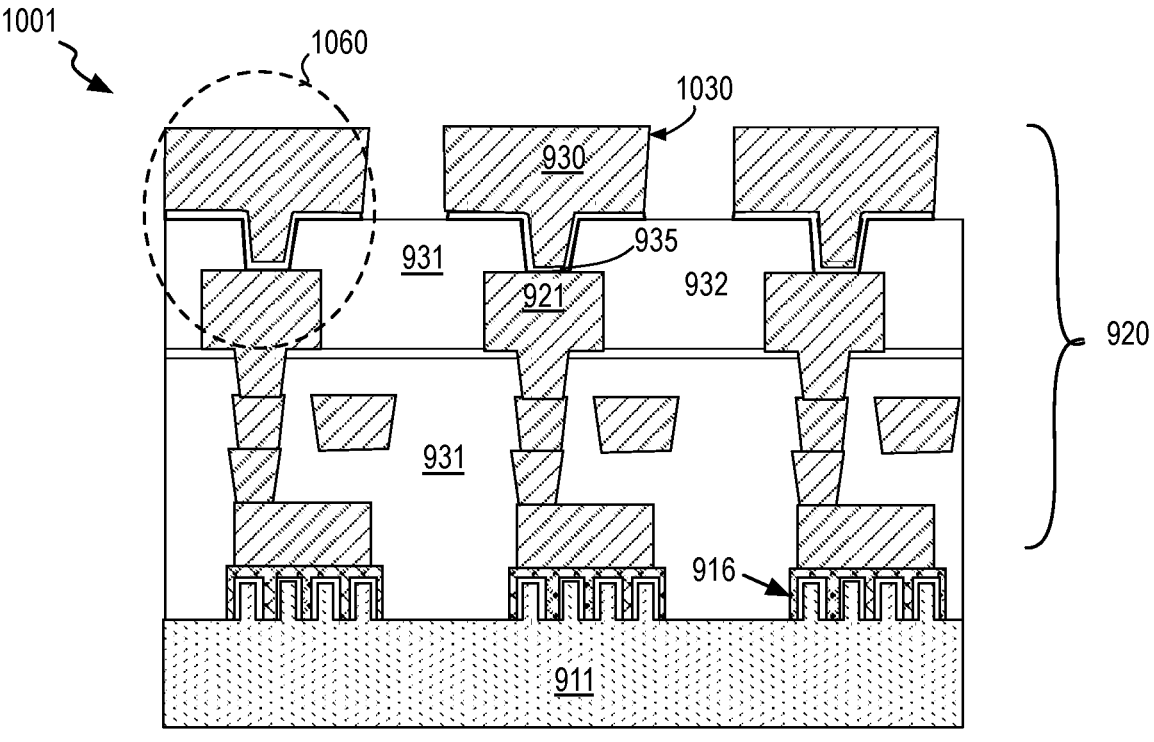

FIGS. 10A and 10B are cross-sectional views of an IC structure portion 1001 evolving as the methods 801 are practiced in accordance with some alternative embodiments. In FIG. 10A, IC structure portion 1001 includes fuse material layer 935 that has been deposited in a via opening 1016 that is not part of a dual-damascene electrode metallization structure. As further illustrated in FIG. 10B, electrode metallization 930 again at least partially fills an upper portion of via opening 1016, but electrode metallization 930 has been subtractively patterned to define electrode feature sidewall 1030 and thereby complete fabrication of via MIM fuse 1060. The etch process employed may be any suitable for the composition of electrode metallization 930 (e.g., W, Ru, Co, Mo, Ti or Pt). In the illustrated example, patterning on electrode metallization 930 also removes fuse material layer 935 from regions between adjacent features of electrode metallization 930. Alternatively, an etching of electrode metallization 930 may be sufficiently selective to stop on fuse material layer 935. Although not illustrated, additional dielectric material 931 may be subsequently deposited over electrode metallization 930 to complete fabrication of an IC device.

Figure 11A:
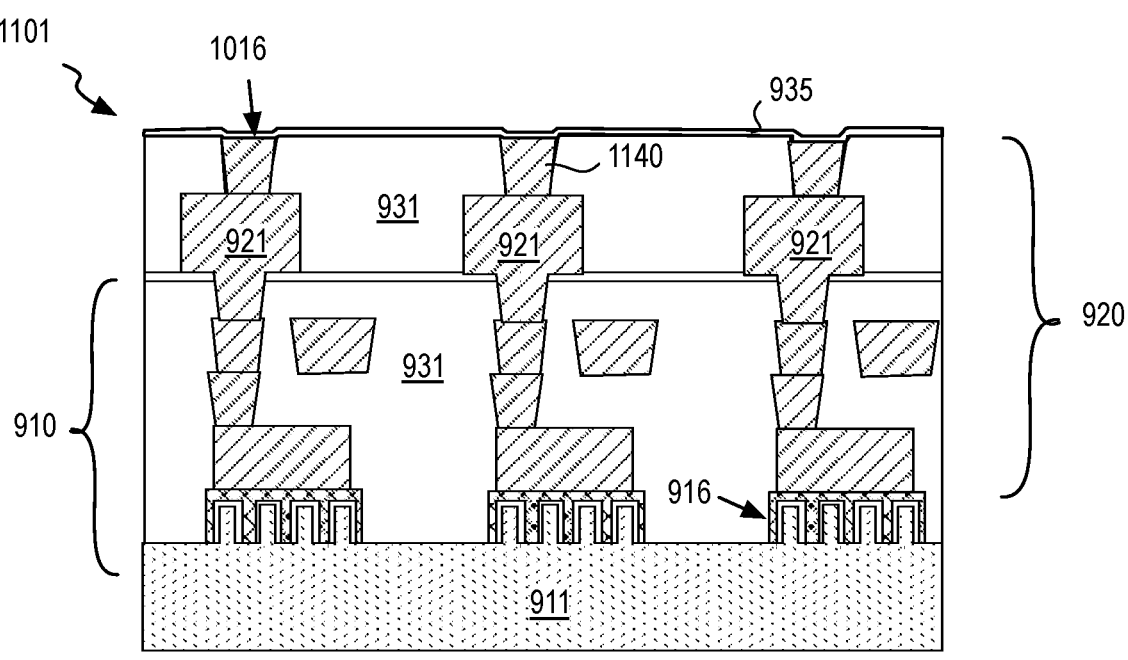
FIGS. 11A and 11B are cross-sectional views of an IC structure evolving as the methods illustrated in FIG. 8 are practiced in accordance with some alternative embodiments.
Figure 11B:
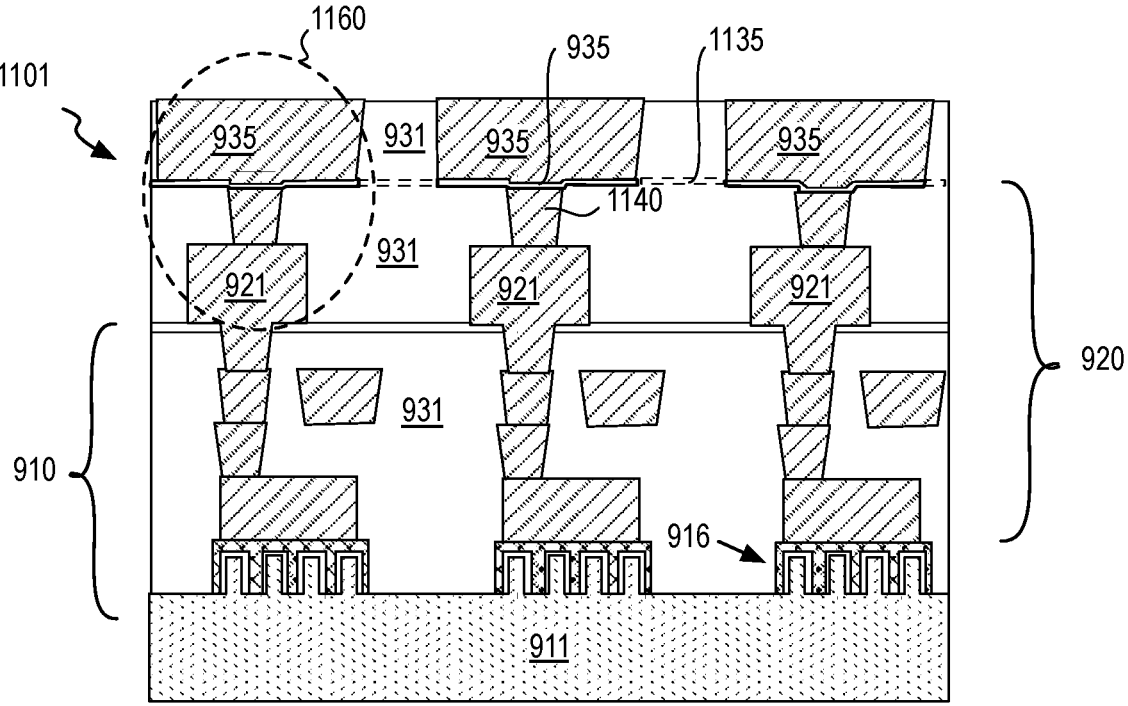

FIGS. 11A and 11B are cross-sectional views of an IC structure portion 1101 evolving as the methods 801 are practiced in accordance with some alternative embodiments where a via MIM fuse includes fuse material at a top interface rather than a bottom interface of a via. As shown in FIG. 11A, a via 1140 is formed after fabrication of fuse electrode metallization 921. In this example, via metallization 1140 is in direct contact with electrode metallization 921. Via metallization 1140 may have been fabricated according to any techniques known to be suitable for interconnect vias, such as, but not limited to, a metal deposition followed by planarization with surrounding dielectric material 931. Following the planarization process, fuse material layer 935 may be deposited, for example according to any of the techniques described elsewhere herein, or according to any technique known to be suitable for a material layer of a particular composition and thickness.

As illustrated in FIG. 11B, IC structure portion 1101 further includes upper electrode metallization 930, completing via MIM fuse 1160. In this example, electrode metallization 930 has been defined through a subtractive etch process that has also removed fuse material layer 935 from between adjacent fuses. However, as illustrated by dashed layer 1135, fuse material layer 935 may remain continuous within an array of fuses if the electrode etch process stops upon fuse material layer 935. Alternatively, where electrode metallization 930 is instead patterned according to a single-damascene planarization process, fuse material layer 935 will be continuous between fuses within an array (e.g., substantially as represented by dashed line 1135).

Any of the interconnect via MIM fuses described above may be implemented in any integrated circuit of any IC die. Such an IC die may include logic and/or memory, for example. The IC die may include both logic and memory, for example where a logic circuit, such as a processor further includes embedded DRAM (eDRAM). Any of the via MIM fuses described above may be implemented within one or more interconnect levels. For example, the IC structure portions described above may be implemented only within logic circuitry, only within memory array circuitry, or within both logic circuitry and memory array circuitry.

Figure 12:
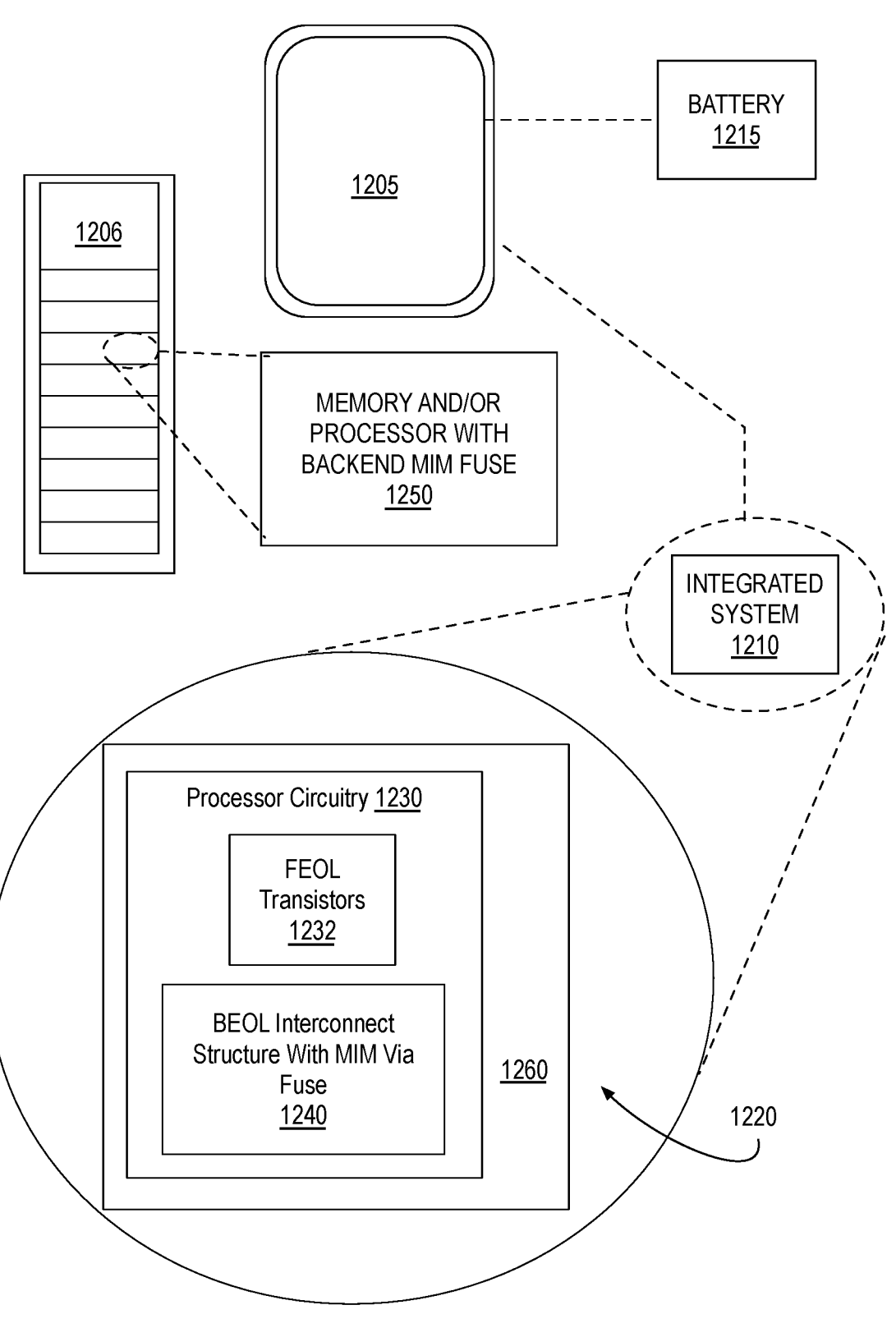
FIG. 12 illustrates a mobile computing platform and a data server machine employing an IC with a via MIM fuse, in accordance with some embodiments.

FIG. 12 illustrates a mobile computing platform 1205 and a data server computing platform 1206 employing an IC including a via MIM fuse, for example within an OTP ROM, and as described elsewhere herein. The server platform 1206 may be any commercial server, for example including any number of high-performance computing platforms disposed within a rack and networked together for electronic data processing, which in the exemplary embodiment includes a microprocessor 1250 including a via MIM fuse, for example within an OTP ROM, and as described elsewhere herein.

The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215. At least one IC of chip-level or package-level integrated system 1210 includes a via MIM fuse, for example within an OTP ROM, and as described elsewhere herein. In the example shown in expanded view 1220, integrated system 1210 includes microprocessor circuitry 1230 including FEOL transistors 1232 and BEOL interconnect fuse structures 1240. In exemplary embodiments interconnect fuse structures 1240 include a via MIM fuse, for example within an OTP ROM, and as described elsewhere herein.

FIG. 13 is a block diagram of a cryogenically cooled computing device 1300 in accordance with some embodiments. For example, one or more components of computing device 1300 may include any of the devices or structures discussed elsewhere herein. A number of components are illustrated in FIG. 13 as included in computing device 1300, but any one or more of these components may be omitted or duplicated, as suitable for the application. In some embodiments, some or all of the components included in computing device 1300 may be attached to one or more printed circuit boards (e.g., a motherboard). In some embodiments, various ones of these components may be fabricated onto a single system-on-a-chip (SoC) die. Additionally, in various embodiments, computing device 1300 may not include one or more of the components illustrated in FIG. 13, but computing device 1300 may include interface circuitry for coupling to the one or more components. For example, computing device 1300 may not include a display device 1303, but may include display device interface circuitry (e.g., a connector and driver circuitry) to which display device 1303 may be coupled.

Computing device 1300 may include a processing device 1301 (e.g., one or more processing devices). As used herein, the term processing device or processor indicates a device that processes electronic data from registers and/or memory to transform that electronic data into other electronic data that may be stored in registers and/or memory. Processing device 1301 may include a memory 1321, a communication device 1322, a refrigeration/active cooling device 1323, a battery/power regulation device 1324, logic 1325, interconnects 1326 (i.e., optionally including redistribution layers (RDL) or metal-insulator-metal (MIM) devices), a heat regulation device 1327, and a hardware security device 1328.

Processing device 1301 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1301 may include a memory 1302, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1321 includes memory that shares a die with processing device 1302. This memory may be used as cache memory and may include embedded dynamic random-access memory (eDRAM) or spin transfer torque magnetic random-access memory (STT-M RAM).

Computing device 1300 may include a heat regulation/refrigeration device 1306. Heat regulation/refrigeration device 1306 may maintain processing device 1302 (and/or other components of computing device 1300) at a predetermined low temperature during operation. This predetermined low temperature may be any temperature discussed elsewhere herein.

In some embodiments, computing device 1300 may include a communication chip 1307 (e.g., one or more communication chips). For example, the communication chip 1307 may be configured for managing wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a nonsolid medium.

Communication chip 1307 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1307 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1307 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1307 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1307 may operate in accordance with other wireless protocols in other embodiments. Computing device 1300 may include an antenna 1313 to facilitate wireless communications and/or to receive other wireless communications (such as AM or FM radio transmissions).

In some embodiments, communication chip 1307 may manage wired communications, such as electrical, optical, or any other suitable communication protocols (e.g., the Ethernet). As noted above, communication chip 1307 may include multiple communication chips. For instance, a first communication chip 1307 may be dedicated to shorter-range wireless communications such as Wi-Fi or Bluetooth, and a second communication chip 1307 may be dedicated to longer-range wireless communications such as GPS, EDGE, GPRS, CDMA, WiMAX, LTE, EV-DO, or others. In some embodiments, a first communication chip 1307 may be dedicated to wireless communications, and a second communication chip 1307 may be dedicated to wired communications.

Computing device 1300 may include battery/power circuitry 1308. Battery/power circuitry 1308 may include one or more energy storage devices (e.g., batteries or capacitors) and/or circuitry for coupling components of computing device 1300 to an energy source separate from computing device 1300 (e.g., AC line power).

Computing device 1300 may include a display device 1303 (or corresponding interface circuitry, as discussed above). Display device 1303 may include any visual indicators, such as a heads-up display, a computer monitor, a projector, a touchscreen display, a liquid crystal display (LCD), a light-emitting diode display, or a flat panel display, for example.

Computing device 1300 may include an audio output device 1304 (or corresponding interface circuitry, as discussed above). Audio output device 1304 may include any device that generates an audible indicator, such as speakers, headsets, or earbuds, for example.

Computing device 1300 may include an audio input device 1310 (or corresponding interface circuitry, as discussed above). Audio input device 1310 may include any device that generates a signal representative of a sound, such as microphones, microphone arrays, or digital instruments (e.g., instruments having a musical instrument digital interface (MIDI) output).

Computing device 1300 may include a global positioning system (GPS) device 1309 (or corresponding interface circuitry, as discussed above). GPS device 1309 may be in communication with a satellite-based system and may receive a location of computing device 1300, as known in the art.

Computing device 1300 may include another output device 1305 (or corresponding interface circuitry, as discussed above). Examples include an audio codec, a video codec, a printer, a wired or wireless transmitter for providing information to other devices, or an additional storage device.

Computing device 1300 may include another input device 1311 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1300 may include a security interface device 1312. Security interface device 1312 may include any device that provides security measures for computing device 1300 such as intrusion detection, biometric validation, security encode or decode, managing access lists, malware detection, or spyware detection. In some examples, security interface device 1312 comprises OTP ROM further including a via MIM fuse, for example as described elsewhere herein.

Computing device 1300, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Notably, embodiments of the present invention are not limited to the specific examples described, but instead can be practiced with modification and alteration without departing from the scope of the appended claims. For example, the above embodiments may include specific combinations of features as further provided below.

In first examples, an integrated circuit (IC) structure comprises a device layer comprising a plurality of transistors. The IC structure comprises a plurality of interconnect metallization levels over the device layer. The interconnect metallization levels comprise a first metallization feature, a second metallization feature over the first metallization feature, and a fuse material layer within a via coupling together the first and second metallization features. The fuse material layer comprises oxygen.

In first examples, for any of the second examples the via extends through a dielectric material between the first and second metallization features, and the fuse material layer is on a sidewall of the via, in direct contact with the dielectric material.

In third examples, for any of the first or second examples the IC structure further comprises a void within the fuse material layer, the void spanning at least 50% of a diameter of the via.

In fourth examples, for any of the first through third examples the fuse material layer is at a bottom of the via structure, in direct contact with the first metallization feature. A bottom of the via has a smaller lateral dimension than that of at least one of the first of second metallization features.

In fifth examples, for any of the fourth examples the bottom of the via has an area less than 0.3 $\mu m^2$.

In sixth examples, for any of the fourth through fifth examples the second metallization feature comprises a top portion of the via, and the second metallization feature is in direct contact with the fuse material layer.

In seventh examples, for any of the first through sixth examples the fuse material layer has a thickness of less than 10 nm.

In eighth examples, for any of the first through seventh examples the fuse material layer comprises predominantly a metal and oxygen.

In ninth examples, for any of the first through eighth examples the fuse material layer is to conduct a non-zero current in response to a first voltage between the first and second metallization features, and is to form an irreversible open circuit in response to a second voltage between the first and second metallization features.

In tenth examples, for any of the ninth examples a magnitude of the second voltage is no more than 3.5 V.

In eleventh examples, an integrated circuit (IC) structure comprises a device layer comprising a plurality of transistors. The IC structure comprises a plurality of interconnect metallization levels over the device layer. The interconnect metallization levels comprise a plurality of via fuses, wherein each of the via fuses comprise a via metallization coupled to first circuit node, and a fuse material layer separating the via metallization from a second circuit node. At least one of the vias comprises a void within a portion of the fuse material layer at a bottom of the via, the void spanning at least 50% of a bottom diameter of the via.

In twelfth examples, for any of the eleventh examples a first of the fuses conducts a non-zero first current in response to a first voltage applied between the first and second circuit nodes, and a second of the fuses comprising the void conducts a second current that is smaller than the first current by at least three orders of magnitude.

In thirteenth examples, for any of the twelfth examples the second current is less than 1e-9 A.

In fourteenth examples, for any of the eleventh through thirteenth examples the fuse material layer comprises a compound of a metal and oxygen and has a thickness less than 10 nm.

In fifteenth examples, a computer platform comprises a power supply, and the IC structure of any of the eleventh through fourteenth examples coupled to the power supply through an IC die package interface.

In sixteenth examples, a method of fabricating an interconnect via fuse comprises forming a first metallization feature over a device layer, the device layer comprising a plurality of transistors. The method comprises forming a dielectric material over the first metallization feature, and the method comprises forming a metal-insulator-metal (MIM) fuse comprising a conductive via extending through the dielectric material, and in contact with a portion of the first metallization feature.

In seventeenth examples, for any of the sixteenth examples forming the MIM fuse comprises forming a via opening through the dielectric material and exposing a portion of the first metallization feature at a bottom of the via opening, depositing a fuse material within the via opening, over at least the bottom of the via, and depositing metal within the via opening, in contact with the fuse material.

In eighteenth examples, for any of the sixteenth examples forming the MIM fuse comprises forming a via opening through the dielectric material and exposing a portion of the first metallization feature at a bottom of the via opening, depositing metal within the via opening, over at least the bottom of the via, planarizing the metal with the dielectric material, depositing a fuse material over the metal and dielectric material, and depositing a second metallization feature over the fuse material.

In nineteenth examples, for any of the sixteenth through eighteenth examples forming the MIM fuse comprises depositing a layer of predominantly Hf and oxygen to a thickness no more than 10 nm.

In twentieth examples, for any of the sixteenth through nineteenth examples forming the first metallization feature comprises depositing a layer of TiN, and wherein forming the MIM fuse comprises depositing a fuse material in contact with the TiN.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) structure, comprising:
   a device layer comprising a plurality of transistors; and
   a plurality of interconnect metallization levels over the device layer, wherein the interconnect metallization levels comprise:
   a first metallization feature;
   a second metallization feature over the first metallization feature; and
   a fuse material layer within a bottom of a via coupling together the first and second metallization features, wherein the fuse material layer comprises oxygen, and wherein
   a programmable electrical resistance of the fuse material layer is a function of a fuse material resistivity divided by a cross-sectional area of the bottom of the via and multiplied by a thickness of the fuse material layer in a direction perpendicular to the cross-sectional area of the bottom of the via.

2. The IC structure of claim 1, wherein the via extends through a dielectric material that is over the first metallization feature, the fuse material layer is in direct contact with the first metallization feature, and the fuse material layer is on a sidewall of the via, in direct contact with the dielectric material.

3. The IC structure of claim 1, further comprising a void within the fuse material layer, the void spanning at least 50% of a diameter of the via.

4. The IC structure of claim 1, wherein:
the fuse material layer is in direct contact with the first metallization feature; and
a bottom of the via has a smaller lateral dimension than that of at least one of the first or second metallization features.

5. The IC structure of claim 4, wherein the cross-sectional area of the bottom of the via is less than 0.3 $\mu m^2$.

6. The IC structure of claim 4, where the second metallization feature comprises a top portion of the via, and the second metallization feature is in direct contact with the fuse material layer.

7. The IC structure of claim 1, wherein the thickness of the fuse material layer less than 10 nm.

8. The IC structure of claim 1, wherein the fuse material layer comprises predominantly a metal and oxygen.

9. The IC structure of claim 1, wherein the fuse material layer is to conduct a first current in response to a first voltage between the first and second metallization features while in a first state, and is to irreversibly transition to a second state in response to a higher second voltage between the first and second metallization features sufficient to physically degrade the fuse material layer within the cross-sectional area of the via, and wherein the fuse material layer is to conduct a second current in the second state, a ratio of the first current to the second current being at least $10^3$.

10. The IC structure of claim 9, wherein a magnitude of the second voltage is no more than 3.5 V.

11. The IC structure of claim 1, wherein the thickness of the fuse material layer at the bottom of the via conveys an electrical current of at least 1e-5A at a voltage below 1V applied across the a first and second metallization features, and wherein in response to the voltage exceeding 2V, the thickness of the fuse material is irreversibly degraded to convey an electrical current of less than 1e-9A.

12. The IC structure of claim 8, wherein the metal is Hf.

13. An integrated circuit (IC) structure, comprising:
a device layer comprising a plurality of transistors; and
a plurality of interconnect metallization levels over the device layer, wherein the interconnect metallization levels comprise:
a plurality of via fuses, wherein each of the via fuses comprise:
a via metallization coupled to a first circuit node; and
a fuse material layer separating the via metallization from a second circuit node; and
wherein at least one of the vias comprises a void within a portion of the fuse material layer at a bottom of the via, the void spanning at least 50% of a bottom diameter of the via.

14. The IC structure of claim 13, wherein:
a first of the via fuses conducts a non-zero first current in response to a first voltage applied between the first and second circuit nodes; and
a second of the via fuses comprising the void conducts a second current that is smaller than the first current by at least three orders of magnitude.

15. The IC structure of claim 14, wherein the second current is less than 1e-9 A.

16. The IC structure of claim 13, wherein the fuse material layer comprises a compound of a metal and oxygen and has a thickness less than 10 nm.

17. A computer platform comprising:
a power supply; and
the IC structure of claim 13 coupled to the power supply through an IC die package interface.

18. The IC structure of claim 13, wherein the via comprises a fuse electrode material over, and in direct contact with, the fuse material layer, and wherein the fuse electrode material comprises polycrystalline silicon, graphite, or one or more of copper, tungsten, nickel, cobalt, aluminum, molybdenum, ruthenium, platinum, or titanium.

19. The IC structure of claim 16, wherein the metal is Hf or Al.

20. The IC structure of claim 15, wherein the fuse material layer at the bottom of the first of the via fuses conveys an electrical current of at least 1e-5A at a voltage below 1V applied across each of the first of the via fuses.

* * * * *